United States Patent [19]

Yazaki

[11] Patent Number: 4,565,443
[45] Date of Patent: Jan. 21, 1986

[54] PRINTING APPARATUS

[75] Inventor: Yoshio Yazaki, Chofu, Japan

[73] Assignee: Orc Manufacturing Co., Ltd., Tokyo, Japan

[21] Appl. No.: 656,924

[22] Filed: Oct. 2, 1984

[30] Foreign Application Priority Data

Feb. 13, 1984 [JP] Japan .................................. 59-24616

[51] Int. Cl.$^4$ ........................................... G03B 27/04
[52] U.S. Cl. ....................................... 355/99; 355/26; 271/5
[58] Field of Search .................... 355/26, 85, 86, 87, 355/91, 94, 93, 99, 78, 79, 72; 271/3, 4, 5, 267, 84; 414/32

[56] References Cited

U.S. PATENT DOCUMENTS

| | | | |
|---|---|---|---|
| 3,912,253 | 10/1975 | Jarman | 271/5 |
| 4,033,695 | 7/1977 | Sader et al. | 355/91 X |
| 4,451,144 | 5/1984 | Gensike | 355/99 |

*Primary Examiner*—Russell E. Adams
*Assistant Examiner*—Brian W. Brown
*Attorney, Agent, or Firm*—Fidelman, Wolffe & Waldron

[57] ABSTRACT

A printing apparatus for exposing works, such as printed circuit boards, to light uses a pallet in which a number of works and at least one associated mask are stored. The works are located in stacked relation to one another. The mask is located above the works. The printing apparatus comprises an exposure device including light sources and transparent plates, an admitting device for holding the pallet in an access position and for holding the uppermost one of the mask and works in the pallet at a certain height, a conveying device including a rail extending from the access position to a takeout position past an exposure position at which an exposure operation is performed, and an attraction device including attraction plates having a number of attraction pads mounted to the underside thereof for attracting and holding the mask and works. Each attraction plate is vertically movable while keeping a horizontal posture. The conveying device further includes two cases one of which can reciprocate between the access position and the exposure position along the rail, the other being capable of reciprocating between the exposure position and the takeout position along the rail.

3 Claims, 21 Drawing Figures

PRINTING APPARATUS

FIELD OF THE INVENTION

The present invention relates to an apparatus for printing workpieces, such as printed circuit boards, which are exposed to light and, more particularly, to a printing apparatus in which a mask and a plurality of workpieces are treated as a group to enhance the efficiency with which the workpieces undergo an exposure operation.

BACKGROUND OF THE INVENTION

A workpiece or work that is exposed to light such as a printed circuit board is subjected to printing operation together with a mask containing a predetermined pattern so that the pattern may be printed on the work by a printing apparatus. In general, the pattern of one mask is projected onto a number of works continuously. Accordingly, works and masks have been entirely separately treated.

More specifically, in a conventional printing apparatus, an exposure device mounted in the center of the apparatus is open and has transparent plates. First, a desired mask is manually installed in a certain positional relation to the transparent plates and held in position. Then, a desired number of works are fed into the printing apparatus, and the works are separately and successively installed in a given positional relation to the transparent plates. Subsequently, the works are exposed to light and carried away from the printing apparatus, thus obtaining the desired number of printed works.

The conventional printing operation as described above presents no serious problems when a large number of works are consecutively printed using a single mask. However, when a limited number, say 20, of works are printed using one (two in case of double-sided printing) mask, it is quite cumbersome to install masks relative to the transparent plates and to remove them. In particular, since the transparent plates are located at the center of the exposure device constituting a key component of the printing apparatus, it is cumbersome to open the exposure device for allowing the transparent plates to be taken out of the printing apparatus. Further, when a mask is being installed, the transparent plates are taken out of the apparatus, and therefore dust tends to adhere to both the exposed transparent plates and the mask, thereby increasing the possibility of occurrence of substandard products. In addition, because the transparent plates are situated in the center of the exposure device, and because components are disposed and driven around the transparent plates, various mechanisms are placed around the transparent plates, making it difficult to obtain a sufficient space. This renders manual installation and removal of masks quite difficult. Each mask is marked with many symbols on its peripheral portion to indicate its kind. If a finger tip makes contact with this peripheral portion and soils it, then the symbols may not be read. To prevent this undesirable situation, the peripheral portion of the mask is provided with a portion of a given width that is grasped while the mask is being handled. The symbols are put down on the inner side of the grasped portion. Hence, the effective area available for marking of a pattern is small as compared as the size of the mask.

In an attempt to eliminate the foregoing difficulties with the conventional printing operation, a new printing apparatus has recently been proposed. According to this proposed apparatus, a storage device in which two kinds of pallets are mounted in stacked and vertically movable relation to each other is mounted near the apparatus. Each of one kind of the pallets receives a desired number of individual masks, while each of the other kind receives a desired number of works. First, one pallet in which a mask to be used is housed is moved upward or downward to a given position. The pallet is then advanced into the printing apparatus and halted in a certain positional relation to transparent plates. Then, a mask is pulled up from inside the pallet by means of a conveying device in the printing apparatus. During this operation, the pallet is moved back into the storage device. Then, the conveying device is lowered to mount the mask in a given positional relation to the transparent plates. Thereafter, another pallet that receives works is advanced from inside the storage device to a given position relative to the transparent plates, and this pallet is mounted in this position in the same way as the mask. Finally, the works are exposed to light. It is certain that this proposed apparatus permits mounting and dismounting of masks relative to the transparent plates to be automatically done and that it is able to eliminate various difficulties associated with the handling of masks. However, this apparatus needs the special-purpose storage device and a computer for controlling the operation of the storage device in accordance with a program, increasing the cost of equipment. Additionally, a larger space is required to operate the printing apparatus. Further undesirably, whenever each work is mounted in a certain positional relation to the transparent plates, a pallet holding works therein must be moved back and forth between the storage device and the transparent plates. Therefore, it takes a long time to expose each one work to light, leading to deterioration in the efficiency with which the operation is performed.

Also, because each pallet usually disposed outside the printing apparatus is brought to a position above the transparent plates in the exposure device lying in the center of the apparatus, it is highly possible that dust or the like adhering to the pallet is conveyed above the transparent plates, and it has not been possible to greatly reduce the occurrence of substandard products due to adhesion of dust.

SUMMARY OF THE INVENTION

It is the main object of the present invention to provide a printing apparatus which is free of the foregoing difficulties with the conventional apparatus.

According to the printing apparatus embodying the present invention, a mask and a number of corresponding works are placed in position as a group, and under this condition these are received in a pallet in such a way that the mask lies above the works. The pallet is advanced to an access position that is set within the apparatus. Then, the mask and the works are taken out of this pallet in succession, and they are stacked in a certain position above transparent plates, thus making preparations for exposure of the works to light.

The objects and features of the invention will become apparent from the ensuing specification and claims when taken with the drawings.

DETAILED DESCRIPTION OF THE INVENTION

Figure 1:
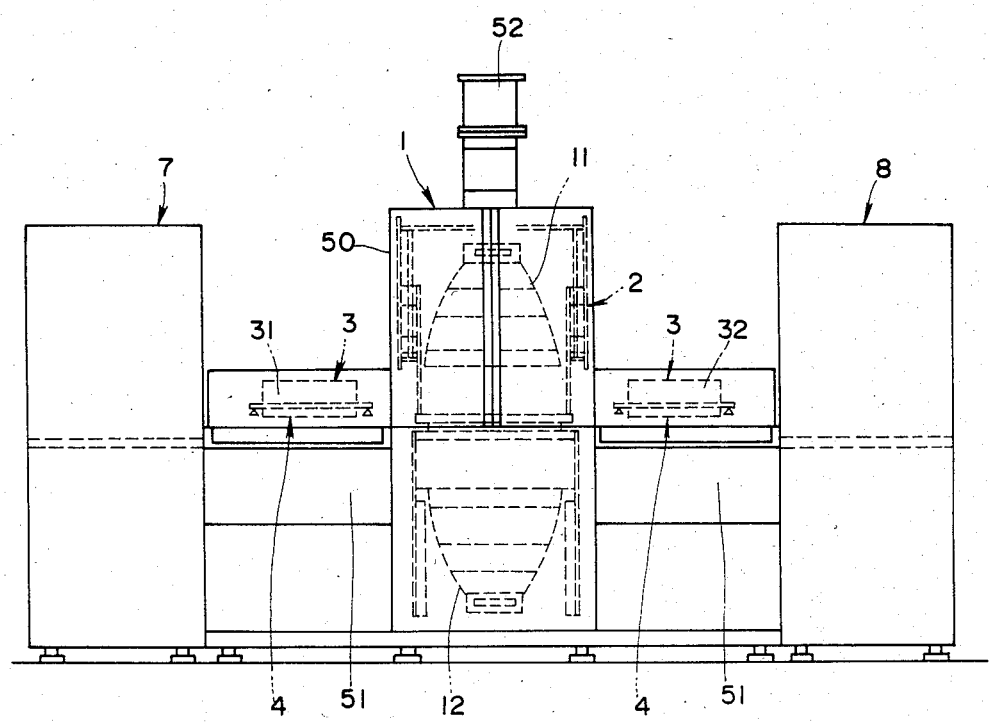
FIG. 1 is a front elevation of the whole structure of a printing apparatus according to the present invention, and in which cases for receiving pallets are disposed on opposite sides.
Figure 2:
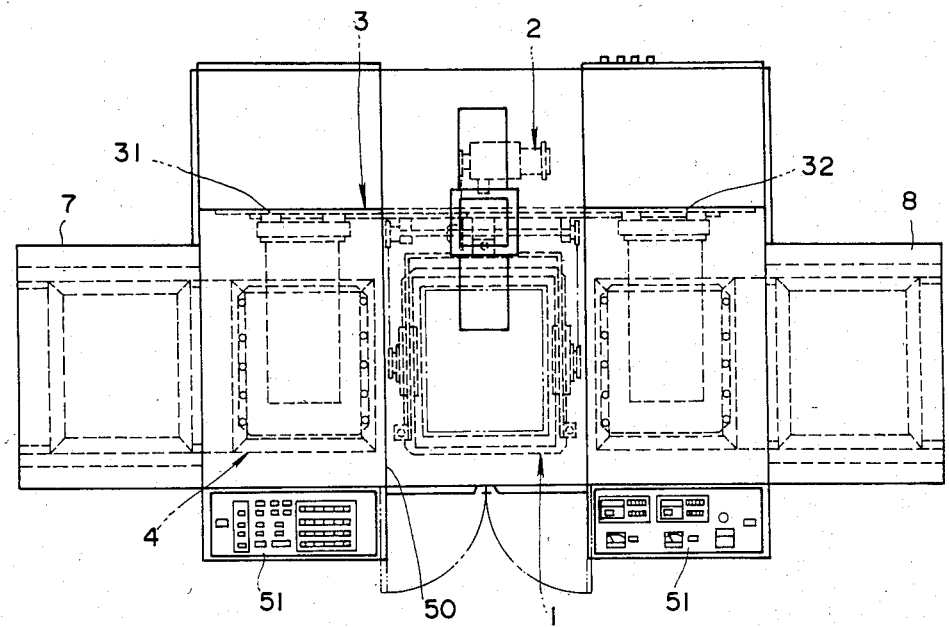
FIG. 2 is a plan view of the whole structure of the apparatus shown in FIG. 1.
Figure 3:
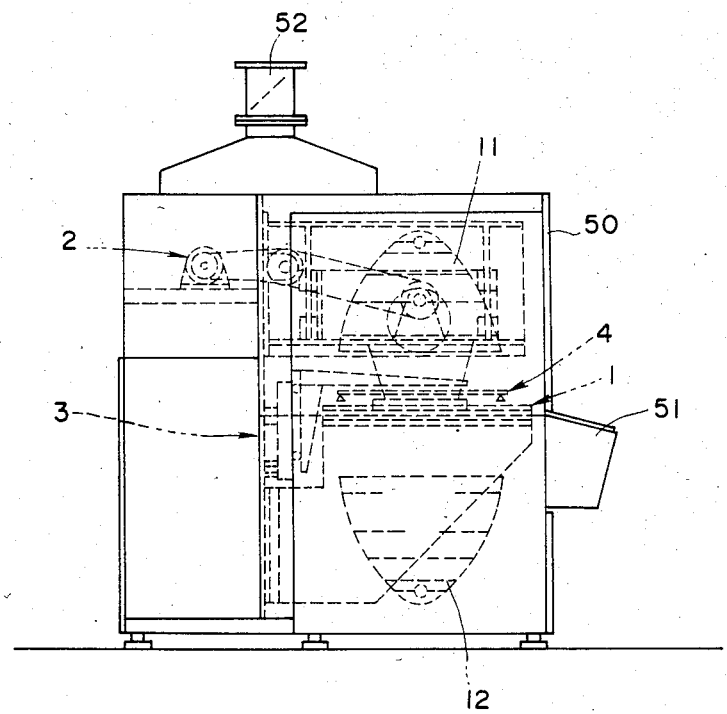
FIG. 3 is a side elevation of the whole structure of the apparatus shown in FIG. 1.
Figure 4:
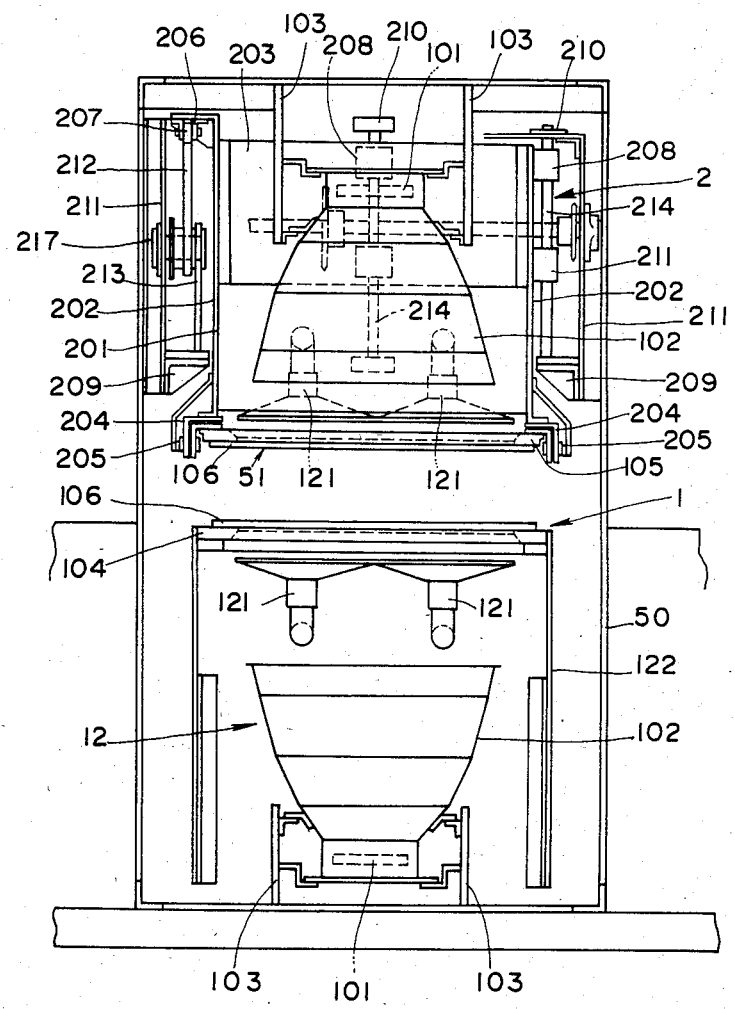
FIG. 4 is a front elevation of an exposure device and an elevating device.
Figure 5:
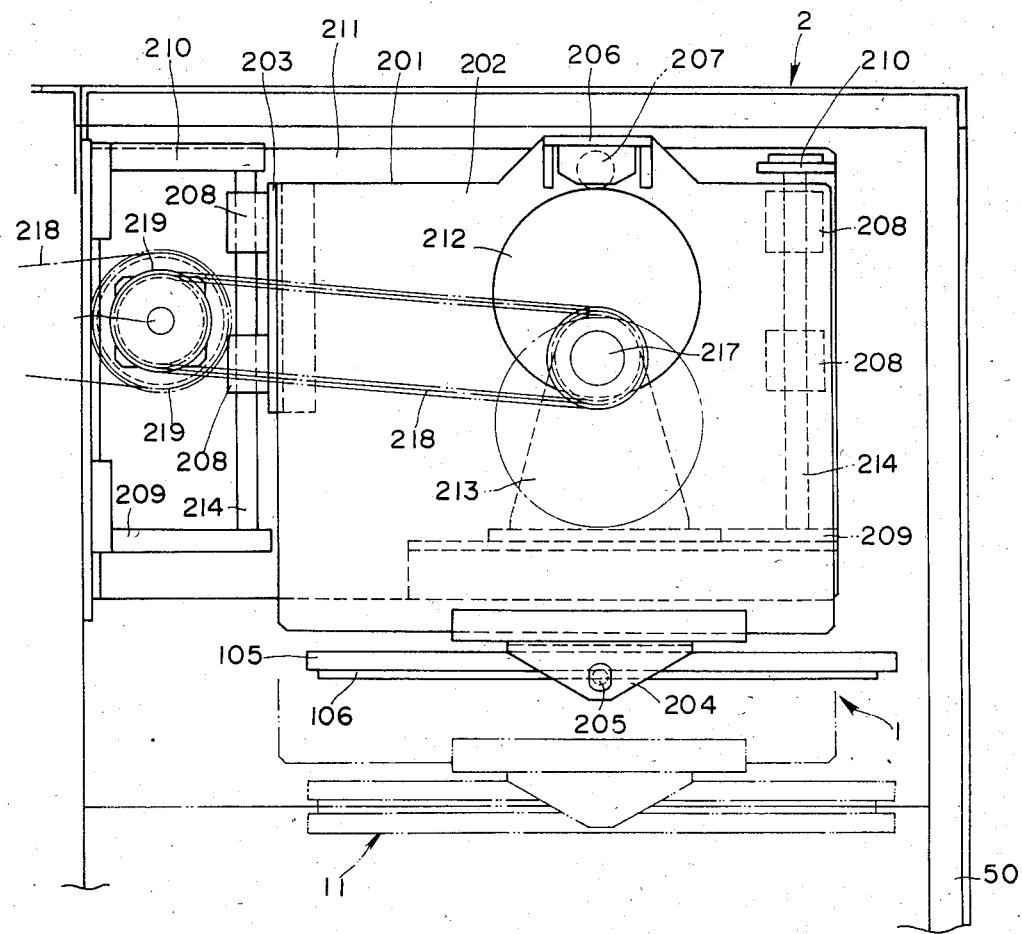
FIG. 5 is a side elevation of the elevating device and the upper frame of the exposure device shown in FIG. 4.
Figure 6:
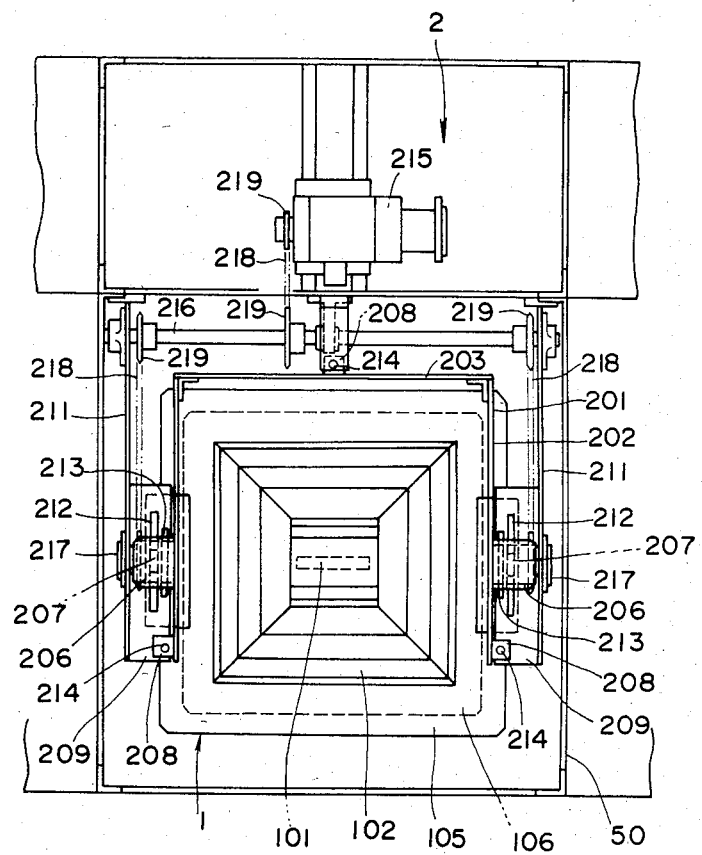
FIG. 6 is a plan view of the exposure device and the elevating device shown in FIG. 4.

A printing apparatus embodying the concept of the present invention is composed of an exposure device 1, an admitting device 5, a conveying device 3, and an attraction device 4, and it makes use of a pallet 9 in which a desired number of works or workpieces are placed in position in stacked relation to one another and held therein. A mask associated with the works is located above the works and held within the pallet 9. The exposure device 1 has lamps 101 each serving as a light source, reflecting mirrors 102, a printing frame, and transparent plates 106. The admitting device 5 acts to hold the pallet 9 in an access position N and to hold the highest one of the mask and works housed in the pallet 9 at a given height. The conveying device 3 includes a rail 301 extending from the access position N to a takeout position S past an exposure position R where an exposure operation is effected, an admitting back plate case 302 reciprocating between the access position N and the exposure position R along the rail 301, and a takeout back plate case 302 reciprocating between the position R and the takeout position S along the rail. The attraction device 4 comprises attraction plates 401 each having a number of attraction pads 402 for attracting the works and mask to the underside thereof and holding them. The plates 401 are mounted to their respective front sides of the cases 302 of the conveying device 3 such that they can vertically move while kept in their horizontal posture.

That is, the novel printing apparatus is comprised of: the exposure device 1 constituting the main component of the apparatus; the admitting device 5 which acts to hold the pallet 9 in position within the exposure device 1, to maintain the mask and works housed in the pallet 9 at given heights, to lower the pallet 9 after the mask and works are all removed from the pallet in such a way that the emptied pallet does not impede the introduction of the next pallet 9 into the printing apparatus, and to take it out from the apparatus; the conveying device 3 in which one of the back plates 302 is capable of reciprocating between the access position N and the exposure position R along the rail 301 and in which the other back plate 302 can move back and forth between the exposure position R and the takeout position S along the rail; and the attraction device 4 which acts to attract the mask and works held in the access position N within the pallet 9 by the action of a vacuum while keeping them in horizontal posture and which is mounted to the front side of both back plates cases 302 of the conveying device 3 so as to be vertically movable a certain stroke while retaining the horizontal posture of the mask and works. The mask and works received in the pallet 9 which is held in the access position N by means of the admitting device 5 are attracted to the attraction device 4 that has been lowered, and they are held on the device 4. Under this condition, the attraction device 4 is elevated, and then the conveying device 3 is driven to move the attraction device 4 to the exposure position R, where the attraction device 4 is then lowered so that the mask and works may be mounted in a certain positional relation to the transparent plates 106 of the exposure device 1. Then, the attraction device 4 is returned to the access position N by the conveying device 3, followed by exposure operation. Each exposed work is taken out to the takeout position S by the action of both the takeout side portion 32 of the conveying device 3 and the attraction device 4.

The illustrated apparatus is so designed as to be capable of printing patterns on both sides of each work fed into the apparatus. For this reason, the exposure device 1 comprises an upper exposure section 11 and a lower exposure section 12 which are essentially similar in structure. The upper exposure section 11 is fixedly secured to the frame 50 of the printing apparatus via an elevating device 2. The individual devices constituting the printing apparatus are next described in succession.

Figure 7:
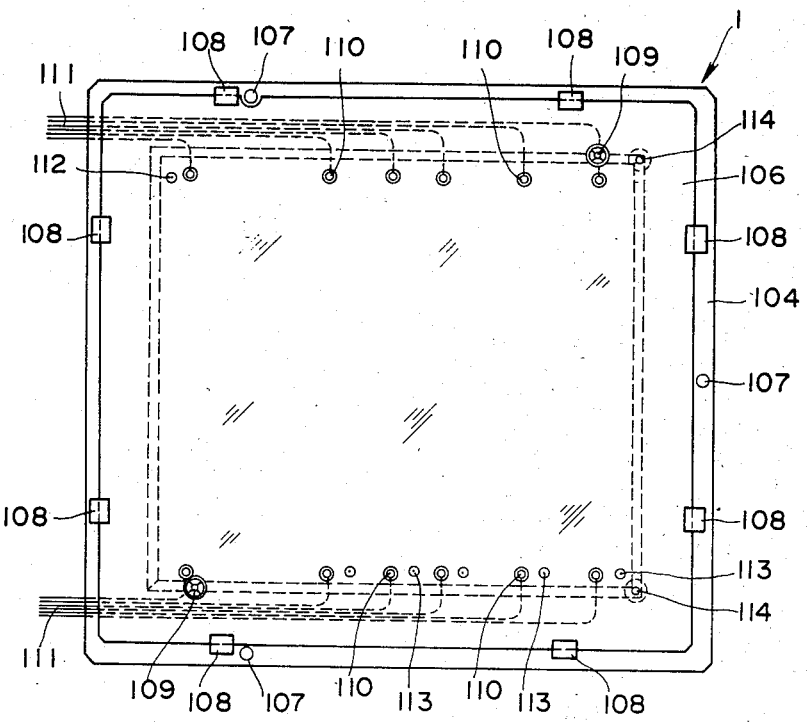
FIG. 7 is a plan view of the lower frame of the exposure device shown in FIGS. 4–6.
Figure 8:
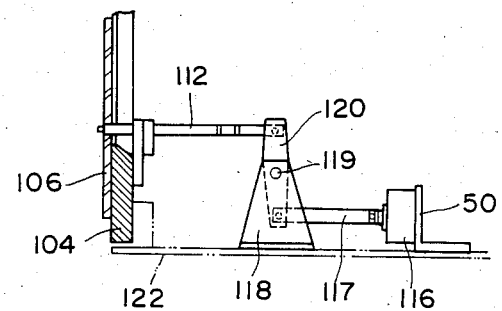
FIG. 8 is a partially longitudinal cross section of the mechanism for moving up and down a reference pin mounted in the exposure device shown in FIGS. 4–7.

Referring next to FIGS. 1–10, the exposure device 1 is placed in the center of the printing apparatus, and consists of the upper exposure section 11 and the lower exposure section 12. The lower section 12 includes the reflecting mirror 102 to which the lamp 101 is mounted. The mirror is directly mounted to the frame 50 and fixedly supported by supports 103. The lower section 12 further includes a lower frame 104, which is directly mounted to the frame 50 and supported by frame members 122 and to which the transparent plate 106 is secured. As shown in FIGS. 7 and 8, the lower frame 104 is rectangular in shape, and is secured to the frame members 122 by bolts 107. The transparent plate 106 is mounted to the frame 104 by fastening members 108.

Figure 10:
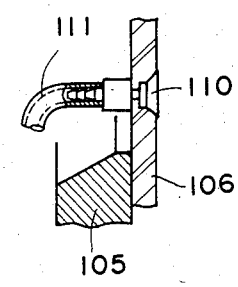
FIG. 10 is a partially longitudinal cross section of one of vacuum pads installed in the exposure device shown in FIGS. 4–7.
Figure 11:
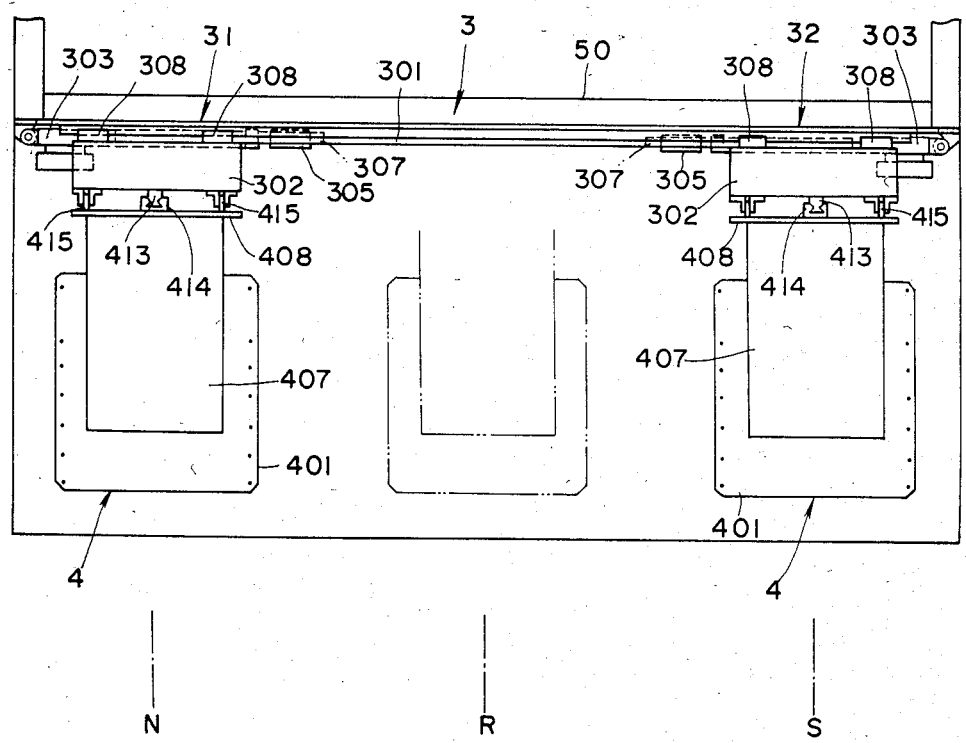
FIG. 11 is a plan view of a conveying device and an attraction device, for showing the geometrical relation of these two devices to the whole structure.
Figure 12:
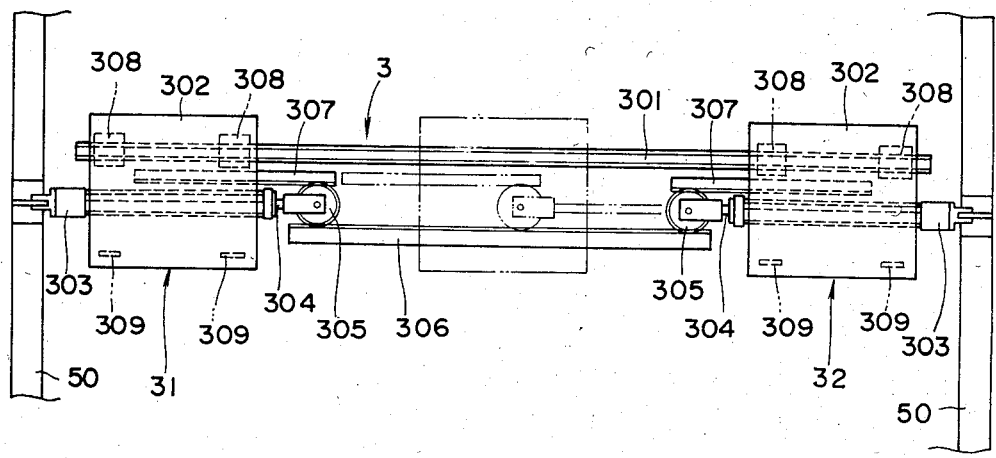
FIG. 12 is a front elevation of the conveying device shown in FIG. 11.
Figure 13:
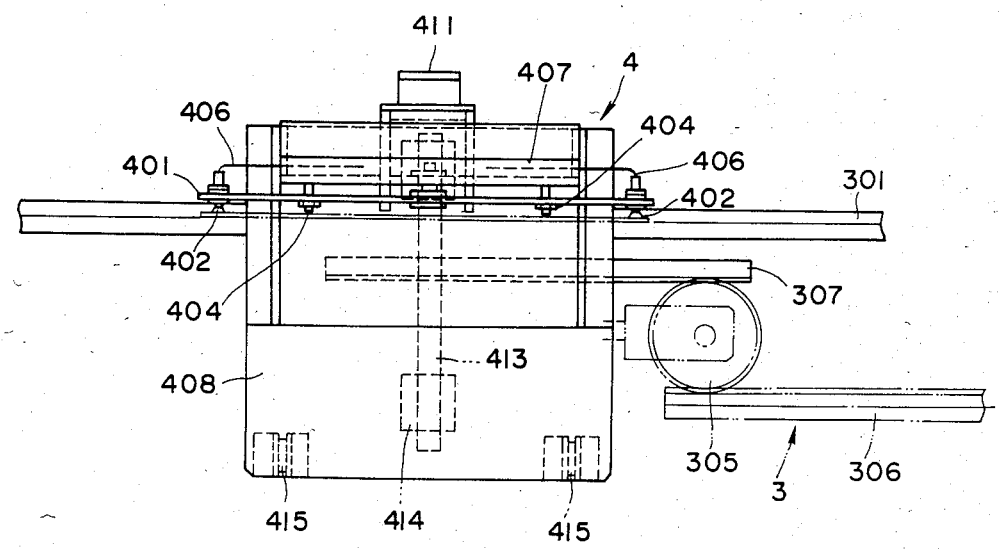
FIG. 13 is a front elevation of the conveying device and the elevating device shown in FIGS. 4–7, for showing the manner in which these two devices are mounted.
Figure 14:
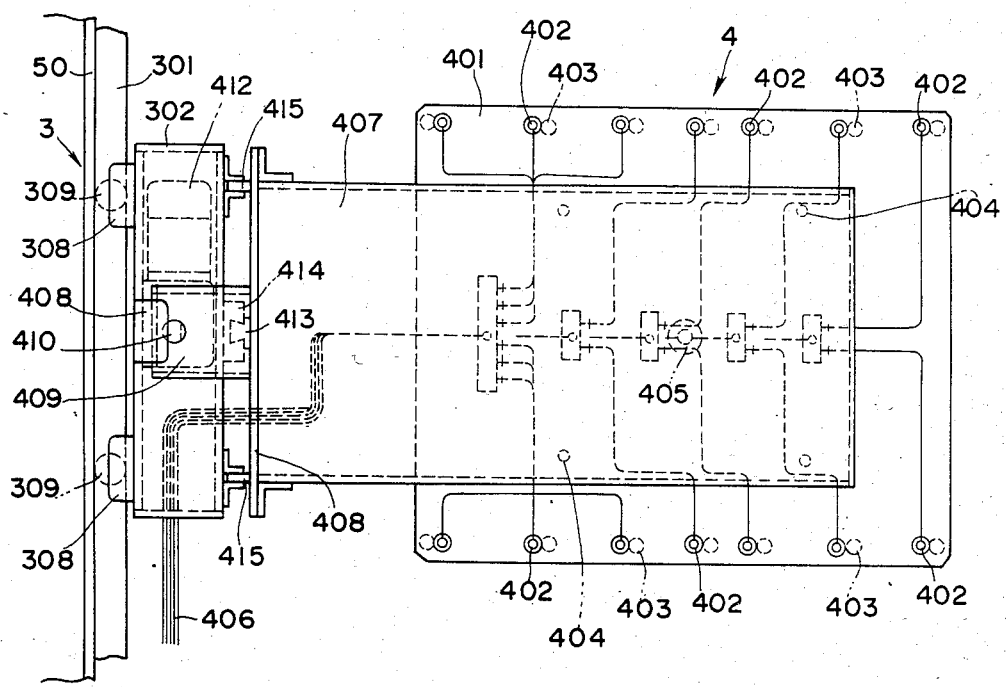
FIG. 14 is a plan view of the elevating device when it is mounted in the conveying device shown in FIG. 13 and other figures.
Figure 15:
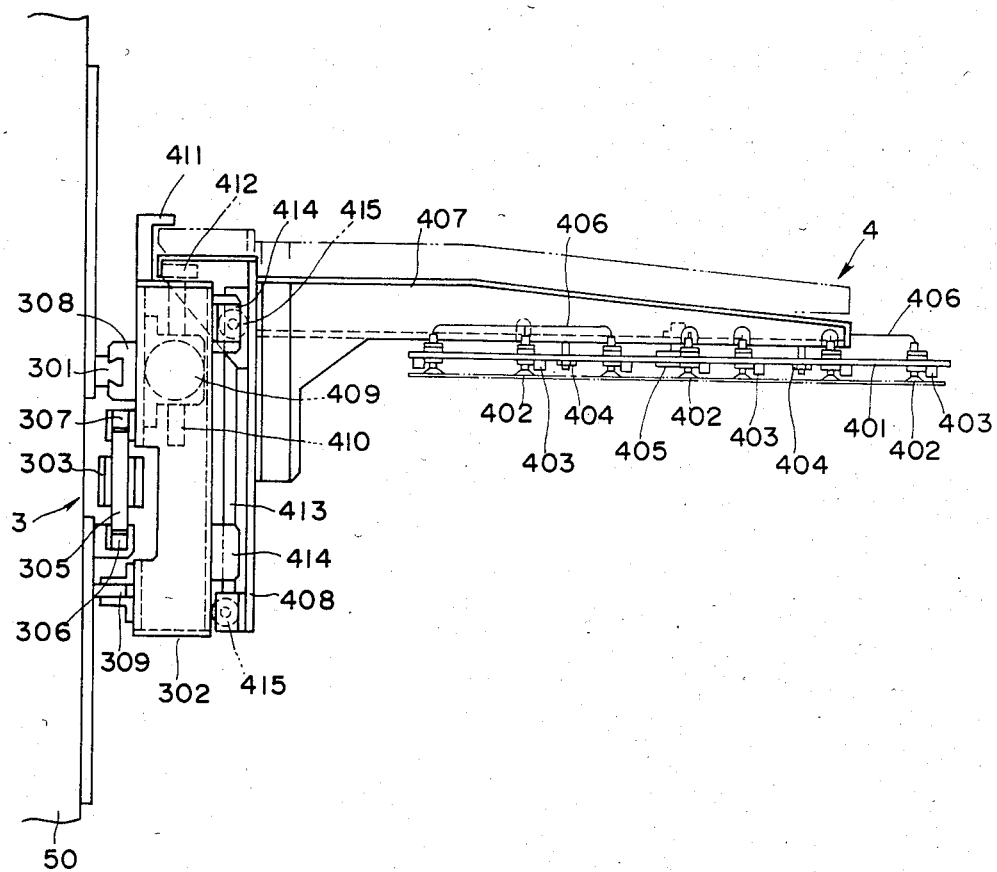
FIG. 15 is a side elevation of the elevating device when it is mounted in the conveying device shown in FIG. 13 and other figures.

As shown in FIG. 10, vacuum pads 110 are mounted to the transparent plate 106 in positions corresponding to the sizes of masks to be attracted and held by the action of a vacuum, and are connected to a vacuum source (not shown) through vacuum pipes 111. The transparent plate 106 is provided with vacuum ports 109 differing from the vacuum pads 110. The ports 109 are connected to a vacuum source in the same manner as the pads 110, and serve to prevent air bubbles from forming and remaining between the set mask and work during exposure operation.

This transparent plate 106 is also formed with a plurality of reference pin holes 113 which form reference positions relative to which masks and works are mounted above the transparent plate 106. A reference pin 112 is always inserted in one of the pin holes 113 which lies at the fringe (left end as viewed in FIG. 7) forming a common reference position relative to which masks and works of various sizes are mounted above the transparent plate 106. The remaining pin holes 113 are formed along the lower fringe shown in FIG. 7, and different ones of them are used depending on sizes of masks and works mounted. As shown in FIG. 8, another reference pin 112 is removably inserted into one of these remaining holes 113 such that this pin 112 will not interfere with use of reference pins 112 in other reference pin holes 113.

In the example shown, each of these reference pins 112 has a base end fixedly mounted to one end of a link 120 which is rotatably mounted by means of a pivot 119 to a bracket 118 firmly secured to the corresponding frame member 122. A cylinder 116 is also fixed to the frame member 122 by a bracket 115, and has a piston rod 117 whose front end is pivotally mounted to the other end of the link 120. Thus, each reference pin 112 can be withdrawn from and inserted into the corresponding reference pin hole 113 by the action of the cylinder 116.

Figure 9:
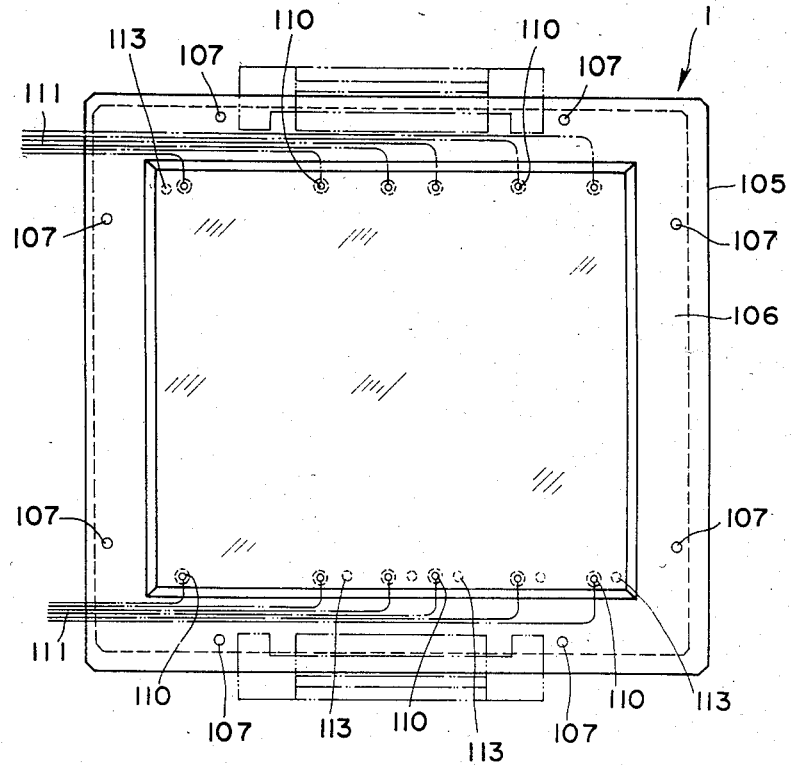
FIG. 9 is a plan view of the upper frame of the exposure device shown in FIGS. 4–7.

As shown in FIG. 9, an upper frame 105 is similar in structure to the lower frame 104 except that reference pin holes 113 formed in it are blind holes to form spaces in which the reference pins 112 mounted in the lower frame 104 and protrude from the pin holes 113 can be introduced, in order to prevent the protruding pins 112 from interfering with the closure of the frame when an exposure operation is performed.

The lower frame 104 is rigidly secured to the frame 50, and establishes reference positions for exposure operation on the upper surface of the transparent plate 106. On the other hand, the upper frame 105 is mounted to the lower end of an elevating frame 201 of the elevating device 2 so as to be angularly movable. Cooling air ducts 121 are provided near the frames 104 and 105 to prevent the mask mounted on the frames 104 and 105 from being overheated.

Referring next to FIGS. 1-6, the elevating device 2 acts to move the upper frame 105 upward or downward. A bracket 204 securely fixed to the lower end of the upper frame 105 is pivotally mounted to the elevating frame 201 by a support pin 205. The elevating frame 201 is moved up or down along guide shafts 214 that are fixedly maintained in an upright posture to vertically move the upper frame 105.

In the example shown, the vertical movement of the elevating frame 201 is made by a pair of circular cam disks 212, which are mounted close to either side of the frame 201 and driven by an electric motor 215. The cam disks 212 are supported by support plates 213 which are affixed via support brackets 210 to side plates 211 mounted near both sides of the elevating frame 201. The cam disks 212 are rotatably mounted to cam shafts 217 to which gears 219 are fixed so that rotating force is transmitted from the motor 215 to the shafts 217. A driving shaft 216 is rotatably held to the rear end of the frame 50 and extends horizontally. A chain 218 is trained between a gear 219 fixed to the shaft 216 and another gear 219 fixed to the shaft of the motor. Other chains 218 are trained between gears 219 fixed to both ends of the driving shaft 216 and their respective gears 219 fixed to the cam shafts 217. Thus, the rotary motion of the motor 215 is imparted to the cam disks 212.

A cam roller 207 is rotatably mounted via a bracket 206 to the center of the upper end of the outer surface of each frame side plate 202 of the elevating frame 201, and is situated just above the corresponding circular cam disk 212. The cam rollers 207 cause the elevating frame 201 to ride on the cam disks 212. As can been seen from FIG. 5, each circular cam disk 212 is fixedly secured to the corresponding cam shaft 217 in an eccentric relation. Therefore, as the cam disks 212 rotate, the cam rollers 207 cause the elevating frame 201 riding on the cam disks 207 to vertically move a distance determined by the eccentricity of the cam shafts 217. To stabilize the vertical movement of the elevating frame 201, this frame is guided in the manner described below. Guide shafts 214 are supported by brackets 210 and support brackets 209 at the front ends of both side plates 211 opposite to both lateral fringes of the front end portion of the elevating frame 201. Also, other guide shafts 214 are mounted to the frame 50 at the rear of the elevating frame 201 by brackets 210 and support brackets 209. Sliding bearings 208 which are fixedly secured to both frame side plates 202 and to a back plate 203 of the elevating frame 201 are mounted to these guide shafts 214, thus rendering the vertical movement of the frame 201 stable. The upper frame 105 is mounted to the elevating frame 201 by the support pins 205 so as to be capable of rocking relative to the frame 201, in order that a uniform compressive force acts on the whole region of each of the works and masks fed between the upper frame 105 and the lower frame 104.

Referring next to FIGS. 1-3 and 11-15, the conveying device 3 is composed of the rail 301 fixed to the frame 50 and the two back plate cases 302. Both back plate cases 302 are mounted on the rail 302 so as to be slidable along the rail that extends straight horizontally from the access position N to the takeout position S past the exposure position S. The access position N is set by the admitting device 5, which introduces the pallet 9 into the novel printing apparatus and retains it within the apparatus. The exposure position R is set by the exposure device 1. The takeout position S is set by the takeout device that is similar in structure to the admitting device 5. The introducing back plate 302 is disposed in an admitting side portion 31, while the takeout back plate case 302 is arranged in the takeout side portion 32.

In the example shown, sliding elements 308 are securely fixed to the upper rear end portion of each back plate case 302 and mounted to the rail 301 so as not to be able to come out of it forward or backward. Rollers 309 which bear on the back side plates of the frame 50 are mounted to the lower portion of the rear surface of each back plate case 302. In this way, the back plate cases 302 are mounted to the rail 301. A fixed rack 306 is mounted below the rail 301 at the side of the back side plates of the frame 50. A movable rack 307 is fixed to the rear surface of each back plate case 302. A pinion gear 305 which is rotatably mounted to the front end of the piston rod 304 of a cylinder 303 is in mesh with the racks 306 and 307, the base end of the rod being fixed to the frame 50. Thus, the back plate cases 302 are allowed to slide along the rail 301. In this conveying device 3, the admitting side portion 31 functions to convey masks and works from the access position N to the exposure position R. The takeout side portion 32 serves to shift each work already subjected to exposure operation from the exposure position R to the takeout positon S.

Referring next to FIGS. 1-3 and 11-15, the attraction device 4 is mounted to the back plate cases 302 of the aforementioned conveying device 3 in such a way as to be vertically movable, and it attracts and holds works and masks by the action of a vacuum. The device 4 consists of two separate portions, i.e., admitting portion and takeout portion, in the same manner as the conveying device 3 mentioned already.

This attraction device 4 consists of the attraction plates 401, two combinations of an arm 407 and a mounting plate 408 for vertically movably mounting the plates 401 to the front surfaces of their respective back plate cases 302 of the conveying device 3, and electric motors 409 for moving up or down the combinations of the arm 407 and the plate 408. Mounted on each attraction plate 401 are a number of attraction pads 402 and pushers 403. Each attraction plate 401 is shaped into a planar form having dimensions adapted to the greatest size of the treated masks and works. To attract masks and works to the underside of the plate utilizing the action of a vacuum, the numerous attraction pads 402 are connected to a vacuum equipment (not shown) through vacuum pipes 406, and are disposed in positions suitable to the sizes of masks and works. The pushers 403 disposed close to the pads 402 help disengage the masks and works from the pads 402.

The attraction plates 401 are mounted to the arms 407 by means of several bolts 404 and central fastening elements 405. The bolts 404 simply act to keep the attraction plates 401 in parallel relation to the arms 407. The plates 401 are fixed to the respective arms 407 only by means of the respective central fastening elements 405 each of which lies in the center, i.e., the center of gravity, of each plate 401.

The mounting plates 408 firmly secure the respective arms 407 such that the arms extend forward from the plates 408. The rear surface of each plate 408 extends upright to hold a rail 413. A coupling plate 412 is mounted to the upper end of this upright extension. Mounted to the front surface of each back plate case 302 that is opposite to each mounting plate 408 are a sliding member 414 and rollers 415 disposed at both ends. The sliding member 414 is in mesh with the rail 413 and capable of sliding along it. Thus, the mounting plates 408, hence the attraction device 4, is guided by these components in vertically moving relative to the back plate cases 302. Disposed within each back plate case 302 is the motor 409 for moving the attraction device 4 upward or downward. A rack 410 constituting the shaft of the motor 409 has its upper end fixed to the coupling plate 412. Upward movement of each mounting plate 408 relative to each back plate case 302 is limited by a stop 411 formed on the upper surface of each back plate case 302, for safety purposes.

Referring next to FIGS. 1-2 and 16-18, the admitting device 5 is so designed that it acts to exactly hold the pallet 9, in which a given mask and a desired number of works are retained in a certain positional relationship, at the access position N, to set the works successively supplied into the exposure device 1 at the position N and at exact heights, to lower the fully emptied pallet 9 from the access position N for preventing the pallet 9 from interfering with the following pallets 9, and then to remove it from the printing apparatus.

More specifically, the admitting device 5 is composed of rails 508 on which the supplied pallet 9 is carried, a base plate 506 to which the rails 508 are mounted, a lifting plate 513 mounted above the base plate 506 so as to be movable upward and downward, an elevating cylinder 501 for driving up or down the base plate 506, a conveyor belt 519 for carrying the pallet 9 away from the printing apparatus, and a mechanism for accurately placing the incoming pallet 9 in the access position N.

The elevating cylinder 501 depends from the underside of a mounting base 505 which is mounted at a slightly lower position within the frame 50. The cylinder 501 has a piston rod 502 whose upper end is joined to the base plate 506. Thus, as the cylinder 501 operates, the base plate 506 is moved up and down. A plurality of (four in the example shown) guide shafts 504 depend from the four corners of the base plate 506. Sliding bearings 503 which engage with their respective guide shafts 504 are mounted to the mounting base 504 to prevent the base plate 506 from inadvertently coming out of its horizontal posture during the vertical motion.

Fixed to the center of the upper surface of the base plate 506 is an electric motor 510 for moving up or down the lifting plate 514. The upper end of a rack shaft 511 constituting the shaft of the motor 510 is connected to the central portion of the lifting plate 514. Rails 508 are mounted in parallel relation to each other and on opposite ends of the upper surface of the base plate 506 (top and bottom ends as viewed in FIG. 17; left and right ends as viewed in FIG. 18) by leg plates 507. Each rail 508 is provided with a stopper 509 at its rear end. The supplied pallet 9 is carried on the rails 508.

The lifting plate 514 is flat and small enough to be able to enter the pallet 9 from below when the pallet 9 is held to the access position N. A plurality of (two in the example shown) guide shafts 513 depend from the underside of the lifting plate 514. Sliding bearings 512 are mounted on the base plate 506, and act to keep the lifting plate 514 in a horizontal posture, because the guide shafts 513 are mounted on the bearings 512 so as to be slidable. A plurality of (four in the example shown) lifting elements 515 are formed on the upper surface of the lifting plate 514. When the lifting plate 514 is raised, the upward force acts on the lifting elements 515 and is then transmitted to a floating base plate 907 formed in the pallet 9 that is held in the access position N. Thus, the lifting plate 514 pushes up the floating base plate 907 while maintaining the horizontal posture of the base plate 907.

Figure 16:
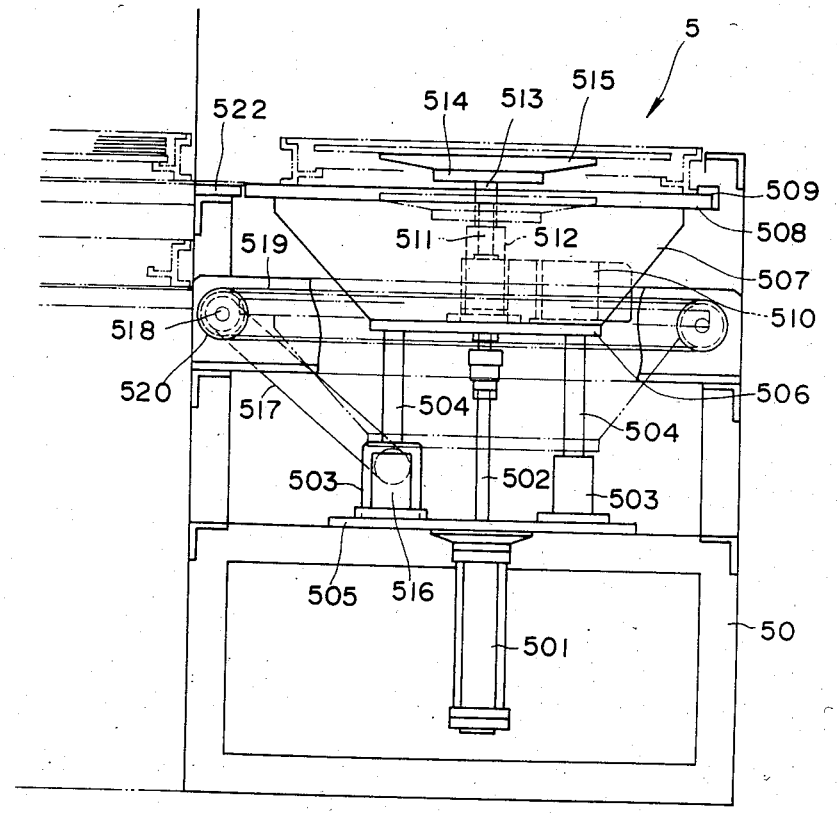
FIG. 16 is a front elevation of an admitting device.
Figure 17:
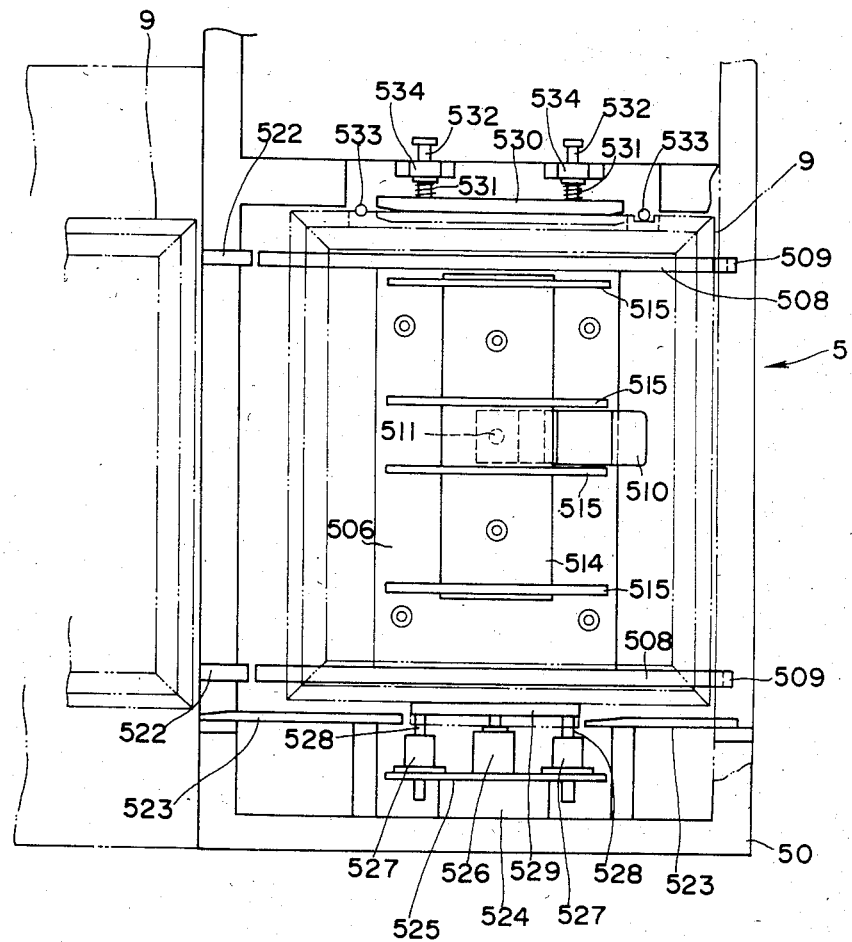
FIG. 17 is a plan view of the admitting device shown in FIG. 16.
Figure 18:
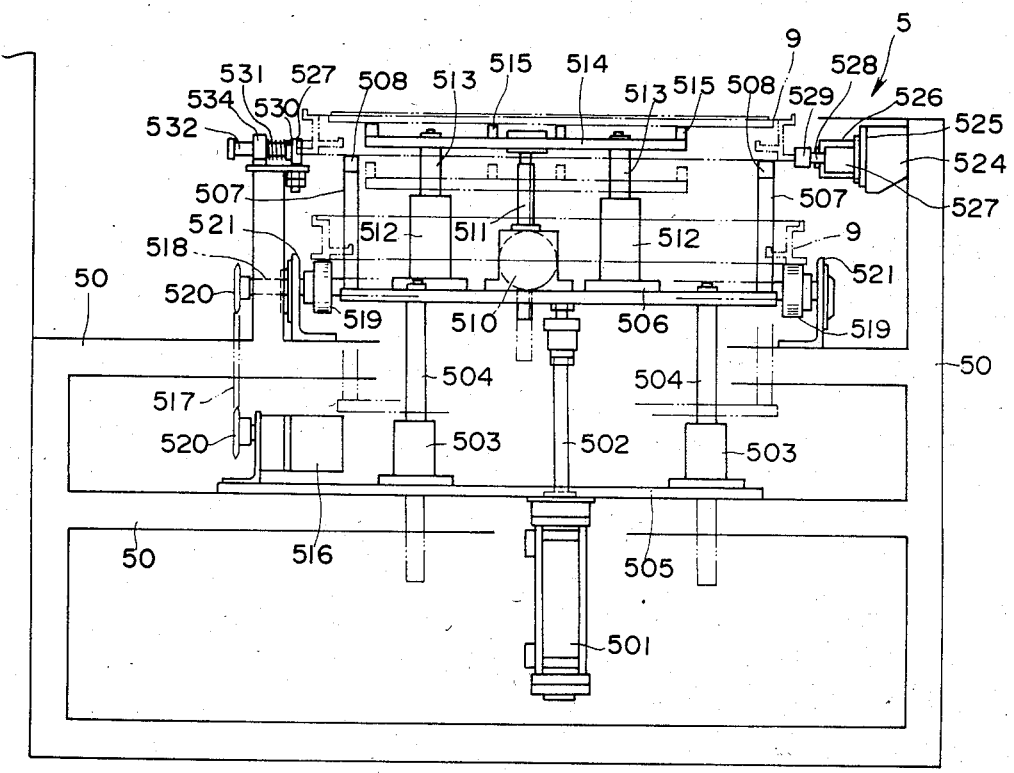
FIG. 18 is a side elevation of the admitting device shown in FIGS. 16 and 17.

The access position N for the pallet 9 is indicated by dot-and-dash lines in FIGS. 16-18. In order to accurately place and firmly hold the pallet 9 in this position N, locating pins 533 and a push element 530 are mounted at the rear of the frame 50, and a shove plate 529 is mounted in front of the frame 50. The shove plate 529 presses the supplied pallet 9 against the locating pins 533 to accurately place the pallet 9 in the access position N. The shove plate 529 is fixed to the front end of the piston rod of a cylinder 526 which is mounted to a mounting plate 525 that is securely fixed to the frame 50 by a bracket 524. Guide shafts 528 which are mounted to sliding bearings 527 so as to be slidable thereon are held by the mounting plate 525, the bearings 527 being mounted on the plate 525. As such, the shove plate 529 is capable of moving back and forth by the operation of the cylinder 526 without inadvertently inclining.

The push element 530 disposed opposite to the shove plate 529 advances the emptied pallet 9 from the access position N (downward as viewed in FIG. 17) to disengage the locating pins 533 from locating notches 905 and 906 formed in the pallet 9, thereby permitting the pallet to move down. The push element 530 is firmly secured to the front end (lower end as viewed in FIG. 17) of each guide stub 532 which is mounted to a bearing member 534 so as to be slidable back and forth, the bearing member 534 being fixed to the frame 50. Accordingly, the push element 530 can move back and forward. The resilience of springs 531 fitted in the guide stubs 532 causes the push element 530 to push the pallet 9 as mentioned above.

The pallet 9 is brought in to the access position N through a feed port formed in one side wall (left side wall as viewed in FIG. 1) of the frame 50. The pallet 9 moves into this feed port by sliding along rails (not shown), and then it rides on a guide rail 522 rigidly mounted on the bottom surface that is in the recesses of the feed port. Thereafter, the pallet slides along the rail 522 while guided by side guide plates 523 until it reaches a rail 508 that lies at the uppermost position, whereby the operation for inserting the pallet is completed.

Two endless conveyor belts 519 extend parallel to each other just below the access position N indicated by the dot-and-dash lines, and are trained between pulleys. The belts 519 are driven by an electric motor 516 to carry the emptied pallet 9 away from the printing apparatus. The motor 516 is fixedly mounted to the aforementioned mounting base 505. A gear 520 is fixed to the shaft of the motor 516. Also, a gear 520 is fixed to a rotating shaft 518 that is the shaft of one of the pulleys over which the belts 519 run. A chain 517 is passed between these two gears 520 to drive the conveyor belts 519 by means of the motor 516.

The conveying device 5 acts to accept the pallet 9 in which a mask and works are received, to hold it in the access position N, and to carry the pallet 9 away from the printing apparatus after it has been emptied. The conveying device 5 is housed in the left block of the frame shown in FIGS. 1 and 2, though it is not given the reference numeral in these figures. It is convenient to arrange the takeout device 6 that is similar in structure to the device 5 in the right block of the frame 50. The takeout device previously places an empty pallet 9 in the takeout position S, stores the works already exposed to light and the mask used for this exposure operation in the pallet 9, lowers it from the position S for preventing an empty pallet 9 next put in the takeout position S from entering the printing apparatus, and then carries it away from the apparatus.

In this way, the pallet 9 to be carried away from the printing apparatus is once lowered from the access position N in the admitting device, and it is again lowered from the takeout position S in the takeout device before it is taken away. This allows the pallet 9 to be received and held as described in connection with FIGS. 1 and 2. Also, a first casing 7 and a second casing 8 both of which can automatically convey any desired pallet 9 from certain locations can be disposed on opposite sides of the printing apparatus. Consequently, it is possible to automatically control the movement of the pallet 9 into and out of the apparatus.

The first casing 7 stores a number of pallets 9, in each of which a desired number of works to be exposed to light and a mask used together with the works are received, such that the pallets can vertically move. The casing 7 accepts empty pallets 9 from the printing apparatus in accordance with a previously loaded program, and then it sends desired pallets 9 toward the printing apparatus.

The second casing 8 is essentially similar to the first casing 7. Specifically, the casing 8 receives pallets 9 each storing many works already exposed to light and a corresponding mask from the printing apparatus, and supplies empty pallets 9 to the takeout position S in the apparatus.

Figure 19:
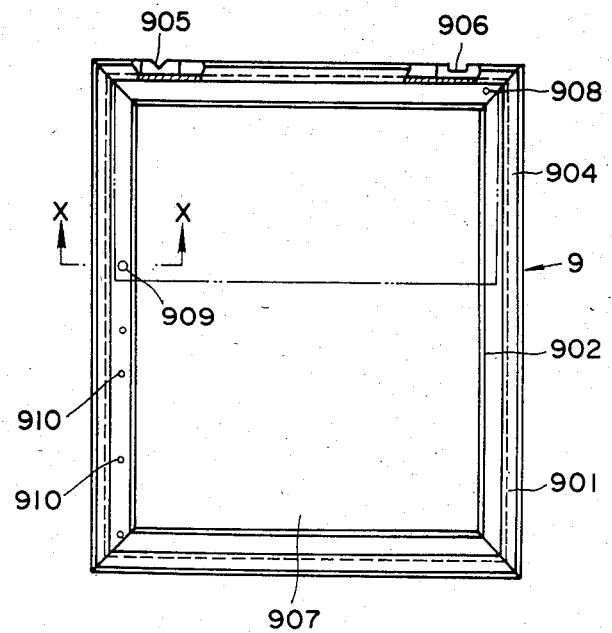
FIG. 19 is a plan view of a pallet.
Figure 20:
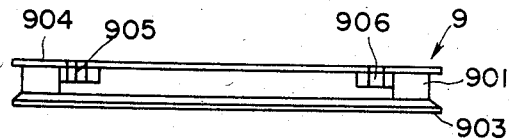
FIG. 20 is a rear elevation of the pallet shown in FIG. 19.
Figure 21:
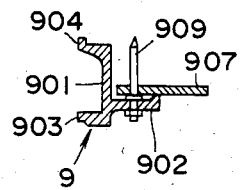
FIG. 21 is a partially cross section taken along line X—X of FIG. 19.

Although no specific limitations are imposed on the structure of the pallet 9 (see FIGS. 19-21) used in the novel printing apparatus, the pallet 9 that can enhance the efficiency of the operation of the apparatus comprises a combination of a body portion and the flat floating bottom plate 907. The body portion is composed of a peripheral wall 901 assuming a rectangular form and having a small height, an upper outer flange 904 formed on the upper end of the outer periphery of the wall 901, a lower outer flange 903 formed at a somewhat lower position on the outer periphery of the wall, and an inner flange 902 formed on the inner periphery at a somewhat lower height. The bottom plate 907 is mounted on the inner flange 902 of the body portion.

A first reference pin 908 extends upright from one side end of the inner flange 902 (right end of the upper portion as viewed in FIG. 19) to set the positions in which masks and works are placed within the pallet 9. A second reference pin 909 cooperates with the first pin 908 to maintain the received masks and works in given posture. Pin holes 910 for setting the second pin 909 are formed in one side portion of the inner flange 902 (left side portion as viewed in FIG. 19) in positions adapted to the sizes of the received masks and works.

The first locating notch 905 and the second locating notch 906 are formed outside the side portion on which the first reference pin 908 is mounted. The locating pins 533 mounted on the aforementioned admitting device 5 engage the notches 905 and 906 to accurately place the pallet 9 in the access position N. The first notch 905 is shaped into a triangular form to locate it in two mutually perpendicular directions in a plane. The second notch 906 is shaped into a rectangle, because this notch simply locates the pallet in the direction of the depth (vertically as viewed in FIG. 19).

The floating bottom plate 907 which is used is selected from those of various dimensions so that it may accommodate the dimensions of the received mask and works. Each bottom plate 907 is provided with pin holes in which the first reference pin 908 and the second reference pin 909 fit, and can be moved up and down by the abovedescribed lifting plate 514 of the admitting device 5 independently of the body portion of the pallet 9.

Referring again to FIGS. 1-3, instructions for operating the printing apparatus are entered by means of a control panel 51. Cooling air is discharged from the exposure device 1 through an exhaust pipe 52. The novel printing apparatus is constructed as thus far described. The operation of the apparatus is hereinafter described for each individual constituent device.

Exposure Device 1

When masks are supplied above and below the transparent plates 106, a vacuum equipment (not shown) causes the exposure device 1 to attract and hold the masks under the condition that they are placed in position by reference pin 112. When a work is brought to the exposure position R which is set above the transparent plate 106 on the lower frame 104 holding a mask by attraction, the work is held between the upper and lower transparent plates 106. At the same time, the air is evacuated through the vacuum port 109, so that the work is set without producing air bubbles between either mask and the work. Pins 114 are used to mount a flat separator (not shown) having the same thickness as the work while maintaining the separator in a certain positional relationship. This separator prevents formation of unwanted gap between the two transparent plates 106 when a small-sized work is used.

Elevating Device 2

The elevating device 2 serves to move the upper frame 105 of the exposure device 1 up and down for installing masks and a work between the upper frame 105 and the lower frame 104 and for removing them. The upper frame 105 is mounted via the support pins 205 to the lower end of the elevating frame 201 of the elevating device 2 so that the upper frame 105 can angularly move about the pins 205. This enables the lower surface of the transparent plate 106 on the upper frame 105 to be entirely brought into contact with the whole upper surface of the supplied work when the work is not uniform in thickness.

Conveying Device 3

The conveying device 3 acts to move the attraction device 4 attached to the back plate cases 302 along the rail 301 between the access position N and the exposure position R or between the position R and the takeout position S by the action of the cylinder 303.

Attraction Device 4

The attraction device 4 attracts the work or mask placed in the access position N or the exposure position R by the action of a vacuum, and moves it upward or downward. Further, the device 4 conveys the attracted mask or work from the access position N to the exposure position R and then to the takeout position S while keeping it in a certain posture in accordance with the aforementioned operation of the conveying device 3.

Admitting Device 5

The admitting device 5 moves up and down the rails 508 between the heights at which the pallet is taken in and out, respectively, by the action of the elevating cylinder 501. Also, the device 5 retains the pallet 9 in the access position N after it has reached that position. Further, the device carries the pallet 9 away from the printing apparatus by the action of the conveyor belt 519 after it has moved down to the takeout position. In addition, the motor 510 in the device 5 successively shifts the works in the pallet 9 to the access position N.

Masks and works are processed by the whole apparatus in the sequence described below. When the pallet 9 is carried onto the rails 508, the cylinder 526 causes the shove plate 529 to press the pallet against the reference pins 533. Then, the motor 510 is operated to move the mask or work located in the uppermost position within the pallet 9 to the access position N. Thereafter, the attraction device 4 disposed just above the access position N is operated to lower the attraction plates 401 for attracting and holding the mask or work. Subsequently, the plates 401 to which the mask or work is attracted is moved upward to the original standby position. Then, the conveying device 3 is operated to move the attraction device 4 holding the work or mask to a position lying just above the exposure position R. Subsequently, the motor 409 in the attraction device 4 is again operated to place the attracted mask or work in the exposure position R.

After masks and a predetermined number of works are carried in as described above, the works are subjected to exposure operation by the use of the masks. Then, these masks and works are conveyed from the exposure position R to the takeout position S, where an empty pallet 9 is held, by means of the takeout side portion 32 of the conveying device 3 and the attraction device 4 mounted to the attraction side portion 32, in exactly the same manner as the foregoing operation. After the works housed in the pallet 9 held in the admitting device 5 are all carried away, backward movement of the cylinder 526 and forward movement of the push element 530 push the pallet 9 out, disengaging it from the locating pins 533. Then, the elevating cylinder 501 is operated to lower the pallet together with the base plate 506 until it is put on the conveyor belt 519, which then carries it away from the printing apparatus. Thereafter, the elevating cylinder 501 is restarted to elevate the rails 508 to the height shown in FIG. 16, thus making preparations for the introduction of the next pallet 9.

After the works already exposed to light and the masks used for this exposure operation are all received in the pallet 9 lying in the takeout position S, the pallet is lowered and then directly conveyed away from the printing apparatus in the same fashion. Then, the apparatus makes preparations for the next operation to hold the next empty pallet 9 in the takeout position S. The completion of the operation and position of each component are sensed by means of detecting means using phototubes, photocouplers, limit switches, or other devices, and the operations described above are carried out in response to the signals resulting from such detections in accordance with a program.

In this way, the novel printing apparatus is capable of continuously handling masks having desired patterns and a desired number of works to be exposed to light as a group by accepting the pallet 9 receiving these masks and works. Therefore, the installation of the masks and the exposure of the works can be performed in one sequence of operations.

For the prior art exposure operation, supply of a mask into a printing apparatus and its setting in the apparatus have been performed completely independently of supply of works into the apparatus and their setting in it. Hence, the supply of the works cannot be initiated before the mask is fed into the apparatus and placed in position. That is, the work must wait for the completion of the operations for the mask. Further, since the operations for the mask are entirely different from the operations for the works, the mask and works are required to be sepately located. This needs separate check operations for the mask and the works, prolonging the time taken to complete the whole process. Furthermore, a number of steps are necessitated. On the other hand, in the novel printing apparatus, a mask and a desired number of works which are received in a single pallet 9 bear previously established accurate positional relation to each other, and the pallet is moved to and held in the fixed access position N within the apparatus. As such, only one operation will suffice to feed the mask and works into the apparatus. Additionally, locating operations in the apparatus are dispensed with.

Another advantage is that masks which have been previously received in the pallet 9 together with one or two masks are stacked above the mask. Thus, the mask and works can be installed relative to the transparent plates 106 in the printing apparatus simply by moving them to the plates from the top one in turn. This makes the conveying mechanism of the apparatus for the above installing operation quite simple. Also, the associated control operations are quite easy to perform. Further, since the pallet 9 storing masks and works is not required to be placed in the exposure device 1 constituting the main portion of the printing apparatus, the structure of the exposure device 1 in which various mechanisms are disposed is not made complex. In addition, what are moved into and out of the apparatus are only masks and works, thereby greately decreasing the possibility that dust intrudes into the exposure device 1. This offers favorable exposure conditions, leading to good exposure operation.

Furthermore, masks and works can be mounted and located in the pallet 9 outside the printing apparatus using convenient equipments. No limitations are imposed on the time taken to perform this operation. Hence, the loading operation of the masks and works in the pallet 9 can be achieved with quite high accuracy. Further, the locating operation itself is easy to effect. The use of the appropriate equipments will prevent human fingers from staining the peripheral portion of the mask, permitting the whole surface of the mask to be more effectively used.

The printing apparatus according to the present invention uses one pallet 9 in which one or more masks and a desired number of works are received for subsequent exposure process. It will be understood that this is quite convenient for the case where a required pattern is projected onto a limited number of works.

As can be seen from the description thus far made, the inventive printing apparatus can treat one or more masks and works as a group in one sequence of processing steps and so the mask can be handled with great ease and accuracy. Also, good exposure operation for the works can be attained. Further, since the whole printing apparatus is simple in structure, it is cheap to manufacture. In addition, operations for locating the mask and works within the apparatus are entirely dispensed with, thus facilitating the operation for exposing the works to light.

It is to be understood that the invention is not limited in its application to the details of construction and arrangement of parts illustrated in the accompanying drawings, since the invention is capable of other embodiments and of being practiced or carried out in various ways. Also, it is to be understood that the phaseology or terminology employed herein is for the purpose of description and not of limitation.

What is claimed is:

1. A printing apparatus employing a pallet that stores a desired number of works located in stacked relation and at least one mask associated with the works, the mask being located above the works, said printing apparatus comprising:

an exposure device having a lamp serving as a light source, a reflecting mirror, a printing frame, and a transparent plate;

an admitting device acting to hold the pallet in an access position and to hold the uppermost one of the mask and works stored in the pallet at a certain height;

a conveying device including a rail extending from the access position to a takeout position past an exposure position, an introducing back plate case reciprocating between the access position and the exposure position along the rail, and a takeout back plate case reciprocating between the exposure position and the takeout position along the rail; and an attraction device including attraction plates each having a number of attraction pads mounted to the underside thereof for attracting and holding the works and mask, the attraction plates being mounted to their respective front surfaces of the back plate cases of the conveying device in such a way as to be vertically movable while keeping their horizontal posture.

2. A printing apparatus employing a pallet that stores a desired number of works located in stacked relation and at least one mask associated with the works, the mask being located above the works, said printing apparatus comprising:

an exposure device consisting of an upper exposure portion and a lower exposure portion, each of these exposure portions including a lamp serving as a light source, a reflecting mirror, a printing frame, and a transparent plate;

an elevating device for holding the upper exposure portion of the exposure device in such a way as to be vertically movable;

an admitting device acting to hold the pallet in an access position and to hold the uppermost one of the mask and works stored in the pallet at a certain height;

a conveying device including a rail extending from the access position to a takeout position past an exposure position, an introducing back plate case reciprocating between the access position and the exposure position along the rail, and a takeout back plate case reciprocating between the exposure position and the takeout position along the rail; and an attraction device including attraction plates each having a number of attraction pads mounted to the underside thereof for attracting and holding the works and mask, the attraction plates being mounted to their respective front surfaces of the back plate cases of the conveying device in such a way as to be vertically movable while keeping their horizontal posture.

3. A printing apparatus employing a pallet that stores a desired number of works located in stacked relation and at least one mask associated with the works, the mask being located above the works, said printing apparatus comprising:

an exposure device having a lamp serving as a light source, a reflecting mirror, a printing frame, and a transparent plate;

an admitting device acting to hold the pallet in an access position and to hold the uppermost one of the mask and works stored in the pallet at a certain height;

a conveying device including a rail extending from the access position to a takeout position past an exposure position, an introducing back plate case reciprocating between the access position and the exposure position along the rail, and a takeout back plate case reciprocating between the exposure position and the takeout position along the rail; and an attraction device including attraction plates each having a number of attraction pads mounted to the underside thereof for attracting and holding the works and mask, the attraction plates being mounted to their respective front surfaces of the back plate cases of the conveying device in such a way as to be vertically movable while keeping their horizontal posture;

the admitting device being designed to lower the pallet from the access position after all the works and mask have been removed from the pallet and then to carry away the emptied pallet by means of a conveyor belt.

* * * * *